United States Patent
Lin et al.

(10) Patent No.: US 10,879,389 B2
(45) Date of Patent: Dec. 29, 2020

(54) SEMICONDUCTOR DEVICE CAPABLE OF HIGH-VOLTAGE OPERATION

(71) Applicant: MEDIATEK INC., Hsinchu (TW)

(72) Inventors: Cheng-Hua Lin, Hsinchu (TW); Yan-Liang Ji, Hsinchu (TW); Chih-Wen Hsiung, Hsinchu (TW)

(73) Assignee: MEDIATEK INC, Hsinchu (TW)

( * ) Notice: Subject to any disclaimer, the term of this patent is extended or adjusted under 35 U.S.C. 154(b) by 0 days.

(21) Appl. No.: 16/710,380

(22) Filed: Dec. 11, 2019

(65) Prior Publication Data

US 2020/0119188 A1 Apr. 16, 2020

Related U.S. Application Data

(63) Continuation of application No. 16/225,077, filed on Dec. 19, 2018, now Pat. No. 10,541,328, which is a
(Continued)

(51) Int. Cl.
*H01L 29/00* (2006.01)
*H01L 29/78* (2006.01)
(Continued)

(52) U.S. Cl.
CPC ...... *H01L 29/7817* (2013.01); *H01L 27/0629* (2013.01); *H01L 28/60* (2013.01);
(Continued)

(58) Field of Classification Search
CPC ............ H01L 29/7817; H01L 29/0649; H01L 29/1095; H01L 29/42376; H01L 29/66681; H01L 29/7831
See application file for complete search history.

(56) References Cited

U.S. PATENT DOCUMENTS

| | | | |
|---|---|---|---|
| 4,811,078 A | 3/1989 | Tigelaar et al. | |
| 5,393,691 A | * 2/1995 | Hsu | H01L 27/0629 257/E21.008 |

(Continued)

FOREIGN PATENT DOCUMENTS

| | | |
|---|---|---|
| CN | 102420142 A | 4/2012 |
| CN | 102569079 B | 12/2014 |

(Continued)

*Primary Examiner* — Nicholas J Tobergte
(74) *Attorney, Agent, or Firm* — McClure, Qualey & Rodack, LLP

(57) ABSTRACT

A semiconductor device includes a semiconductor substrate having a first conductivity type, a first well region formed in a portion of the semiconductor substrate, having a second conductivity type that is the opposite of the first conductivity type. A second well region is formed in a portion of the first well region, having the first conductivity type. A first gate structure is formed over a portion of the second well region and a portion of the first well region. A first doped region is formed in a portion of the second well region. A second doped region is formed in a portion of the first well region, having the second conductivity type. A second dielectric layer is formed over a portion of the first gate structure, a portion of the first well region, and a portion of the second doped region.

21 Claims, 6 Drawing Sheets

Related U.S. Application Data continuation of application No. 15/411,099, filed on Jan. 20, 2017, now Pat. No. 10,199,496.

(60) Provisional application No. 62/306,661, filed on Mar. 11, 2016.

(51) Int. Cl.

| | |
|---|---|
| *H01L 29/40* | (2006.01) |
| *H01L 27/06* | (2006.01) |
| *H01L 49/02* | (2006.01) |
| *H01L 29/06* | (2006.01) |
| *H01L 29/10* | (2006.01) |
| *H01L 29/423* | (2006.01) |
| *H01L 29/66* | (2006.01) |

(52) U.S. Cl.
CPC ...... *H01L 29/0649* (2013.01); *H01L 29/1095* (2013.01); *H01L 29/402* (2013.01); *H01L 29/42376* (2013.01); *H01L 29/66681* (2013.01); *H01L 29/7816* (2013.01); *H01L 29/7831* (2013.01)

(56) References Cited

U.S. PATENT DOCUMENTS

| | | |
|---|---|---|
| 6,448,611 B1 | 9/2002 | Oh |
| 6,710,416 B1 | 3/2004 | Xu |
| 6,825,531 B1 | 11/2004 | Mallikarjunaswamy |
| 9,761,657 B2 | 9/2017 | Hsiao et al. |
| 10,199,496 B2 * | 2/2019 | Lin ................... H01L 29/66681 |
| 2004/0021182 A1 | 2/2004 | Green et al. |
| 2005/0253167 A1 | 11/2005 | Wu et al. |
| 2005/0253168 A1 | 11/2005 | Wu et al. |
| 2007/0007591 A1 | 1/2007 | Theeuwen et al. |
| 2007/0096205 A1 | 5/2007 | Ko et al. |
| 2007/0108533 A1 | 5/2007 | Sekiguchi et al. |
| 2008/0014690 A1 | 1/2008 | Chu et al. |
| 2008/0070371 A1 | 3/2008 | Wang |
| 2008/0253168 A1 | 10/2008 | Blanchard et al. |
| 2011/0260247 A1 | 10/2011 | Yang et al. |
| 2012/0068772 A1 | 3/2012 | Murad et al. |
| 2012/0126323 A1 | 5/2012 | Wu et al. |
| 2012/0211832 A1* | 8/2012 | Chu ................... H01L 29/7816 257/335 |
| 2012/0228704 A1 | 9/2012 | Ju |
| 2013/0020632 A1 | 1/2013 | Disney |
| 2013/0146973 A1 | 6/2013 | Mitra et al. |
| 2013/0320432 A1 | 12/2013 | Ng et al. |
| 2014/0167171 A1 | 6/2014 | Kaya et al. |
| 2015/0123199 A1 | 5/2015 | Chen et al. |
| 2015/0194494 A1 | 7/2015 | Ahn et al. |
| 2015/0211832 A1 | 7/2015 | Travis |
| 2015/0236150 A1 | 8/2015 | Chen et al. |
| 2016/0093729 A1 | 3/2016 | Wang et al. |
| 2016/0172490 A1 | 6/2016 | Lao et al. |
| 2017/0077250 A1 | 3/2017 | Hsiao et al. |
| 2017/0077293 A1 | 3/2017 | Chien et al. |
| 2017/0110536 A1 | 4/2017 | Hsiao et al. |
| 2017/0229570 A1 | 8/2017 | Cheng et al. |
| 2017/0263717 A1 | 9/2017 | Lin et al. |
| 2017/0263761 A1 | 9/2017 | Hu et al. |
| 2017/0263764 A1 | 9/2017 | Lin et al. |

FOREIGN PATENT DOCUMENTS

| | | |
|---|---|---|
| JP | H09237841 A | 9/1997 |
| WO | 2012/147456 A1 | 11/2012 |

* cited by examiner

SEMICONDUCTOR DEVICE CAPABLE OF HIGH-VOLTAGE OPERATION

CROSS REFERENCE TO RELATED APPLICATIONS

This application is a Continuation of pending U.S. Ser. No. 16/225,077, filed on Dec. 19, 2018, which is a Continuation of Ser. No. 15/411,099, filed on Jan. 20, 2017 (now U.S. Pat. No. 10,199,496, issued on Feb. 5, 2019), which claims the benefit of U.S. Provisional Application No. 62/306,661 filed Mar. 11, 2016, the entirety of which is incorporated by reference herein.

BACKGROUND OF THE INVENTION

Field of the Invention

The present invention relates to integrated circuits (ICs), and in particular to semiconductor devices capable of high-voltage operation and methods for forming the same.

Description of the Related Art

Recently, as demand has increased for high-voltage devices such as power semiconductor devices, there has been an increasing interest in research on high-voltage metal-oxide-semiconductor field effect transistors (HV MOSFETs) applied in high-voltage devices.

Among the various types of high-voltage metal-oxide-semiconductor field effect transistors (HV MOSFETs), semiconductor devices such as lateral double diffused metal-oxide-semiconductor (LDMOS) devices are often used.

However, with progress being made in semiconductor fabrication, the breakdown voltage of high-voltage MOSFETs for high-voltage devices needs to be increased further. Thus, a reliable high-voltage MOSFET for high-voltage devices having an increased breakdown voltage is needed to meet device performance requirements as the needs in semiconductor fabrication of high-voltage devices continue.

BRIEF SUMMARY OF THE INVENTION

An exemplary semiconductor device comprises a semiconductor substrate, a first well region, a second well region, a first gate structure, a first doped region, a second doped region, and a second gate structure. The semiconductor substrate has a first conductivity type, and the first well region formed is in a portion of the semiconductor substrate, having a second conductivity type that is the opposite of the first conductivity type. The second well region is formed in a portion of the first well region, having the first conductivity type. The first gate structure is formed over a portion of the second well region and a portion of the first well region. The first doped region is formed in a portion of the second well region, having the second conductivity type. The second doped region is formed in a portion of the first well region, having the second conductivity type. The second gate structure is formed over a portion of the first gate structure, a portion of the first well region, and a portion of the second doped region.

An exemplary method for forming a semiconductor device comprises providing a semiconductor structure comprising a first gate structure, a first well region, and a second doped region, and forming a second gate structure over a portion of the first gate structure, a portion of the first well region, and a portion of the second doped region. The semiconductor structure further comprises a semiconductor substrate, a second well region, a first gate structure, and a first doped region. The semiconductor substrate has a first conductivity type, and the first well region is formed in a portion of the semiconductor substrate, having a second conductivity type that is the opposite of the first conductivity type. The second well region is formed in a portion of the first well region, having the first conductivity type. The first doped region is formed in a portion of the second well region, having the second conductivity type. The second doped region is formed in a portion of the first well region, having the second conductivity type. The first gate structure is formed over a portion of the second well region and a portion of the first well region.

Another exemplary method for forming a semiconductor device comprises providing a semiconductor structure comprising a first gate structure, a first well region, and a second doped region in a first region, and an isolation element in a second region, and simultaneously forming a second gate structure over a portion of the first gate structure, a portion of the first well region, and a portion of the second doped region in the first region, and a third gate structure over a portion of the isolation element in the second region. The semiconductor structure further comprises a semiconductor substrate, a second well region, a first gate structure, and a first doped region. The semiconductor substrate has a first conductivity type, and the first well region is formed in a portion of the semiconductor substrate in the first region, having a second conductivity type that is the opposite of the first conductivity type. The second well region is formed in a portion of the first well region, having the first conductivity type. The first doped region is formed in a portion of the second well region, having the second conductivity type. The second doped region is formed in a portion of the first well region, having the second conductivity type. The first gate structure is formed over a portion of the second well region and a portion of the first well region. The isolation element is formed in a portion of the semiconductor substrate in a second region that is different from the first region. The third conductive layer is formed over the isolation element.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1-6 are schematic cross sections showing a method for forming a semiconductor device according to an embodiment of the invention, respectively showing an intermediate stage of the method. The semiconductor device formed by the method shown in FIGS. 1-6 comprises a high-voltage metal-oxide-semiconductor field effect transistor (HV MOSFET) capable of high-voltage (e.g. 100 volts or above) operations.

Figure 1:
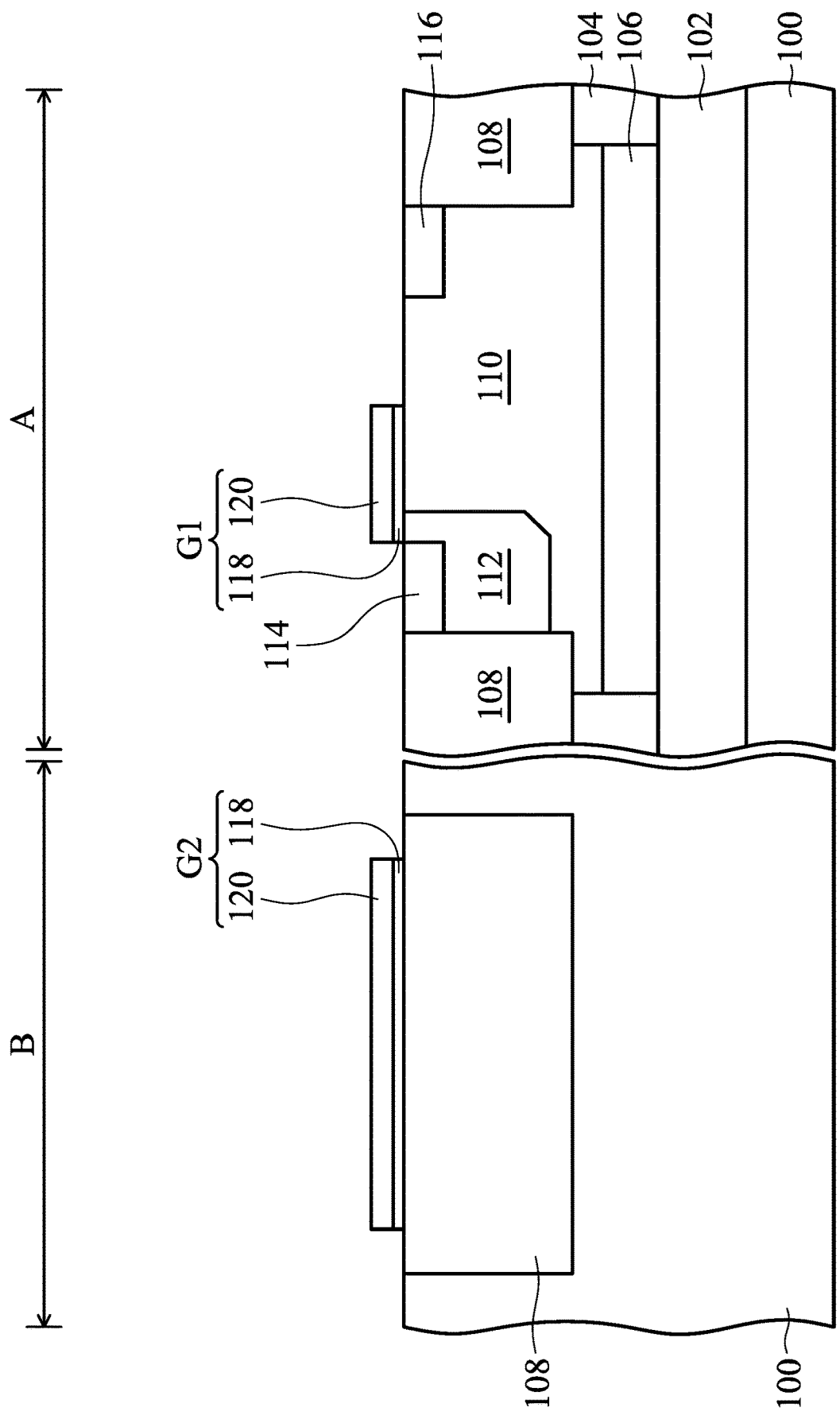
FIG. 1 is schematic cross section showing an intermediate stage of a method for forming a semiconductor device according to an embodiment of the invention.

In FIG. 1, a substantially fabricated semiconductor structure is provided. As shown in FIG. 1, the semiconductor structure is provided with two different regions A and B. Region B can be adjacent to region A or separated from region A by another region (not shown) formed therebetween.

As shown in FIG. 1, the semiconductor structure in region A comprises a semiconductor substrate 100 such as a silicon substrate. The semiconductor substrate 100 may have a first conductivity type such as P-type. An isolation element 108 is respectively disposed in opposite end portions of the substrate 100 in region A. The isolation elements 108 can be the shallow trench isolation (STI) elements shown in FIG. 1, but are not limited thereto. In some embodiments, the isolation elements 108 can be field oxide (FOX) isolation elements. The isolation elements 108 may comprise insulating materials such as silicon oxides, but they are not limited thereto. A deep well region 102 is formed in a portion of the semiconductor substrate 100 underlying the isolation elements 108. The deep well region 102 may have a second conductive type that is the opposite of the first conductivity type, for example N-type. Moreover, a well region 104 is formed between the deep well region 102 and each of the isolation elements 108. A well region 106 is formed in a portion of the semiconductor substrate between the well regions 104, and is above the deep well region 102. The well regions 104 and the well region 106 may have the first conductivity type, for example P-type. A well region 110 is formed in the semiconductor substrate 100 between the isolation elements 108, the well region 106 and the well regions 104. The well region 110 may have the second conductive type, for example N-type. A well region 112 is formed in a portion of the well region 110 and is adjacent to the one isolation element 108. The well region 112 may have the first conductivity type, for example P type. A doped region 114 is formed in a portion of the well region 112, and may have the second conductivity type, for example N-type. Another doped region 116 is formed in a portion of the well region 110, and is adjacent to the right isolation element 108. The doped region 116 may have the second conductivity type, for example N-type. The doped regions 114 and 116 may have a doping concentration greater than that of the well region 110.

In region A, a gate structure G1 is formed over a portion of the well region 112 and a portion of the well region 110, comprising a dielectric layer 118 and a conductive layer 120 formed over the dielectric layer 118. In one embodiment, in region A, the gate dielectric layer 118 may comprise silicon oxide, silicon nitride or the like, and may have a thickness of about 23-140 Å. The conductive layer 120 may comprise conductive materials such as polysilicon, metal or the like, and may have a thickness of about 800-2000 Å.

In addition, the semiconductor structure in region B further comprises another isolation element 108 formed in a portion of the substrate 100. Another gate structure G2 is formed over a portion of the isolation element 108, comprising the dielectric layer 118 and the conductive layer 120. In one embodiment, in region B, the gate dielectric layer 118 may comprise silicon oxide, silicon nitride or the like, and may have a thickness of about 23-140 Å. The conductive layer 120 may comprise conductive materials such as polysilicon, metal or the like, and may have a thickness of about 800-2000 Å.

Figure 2:
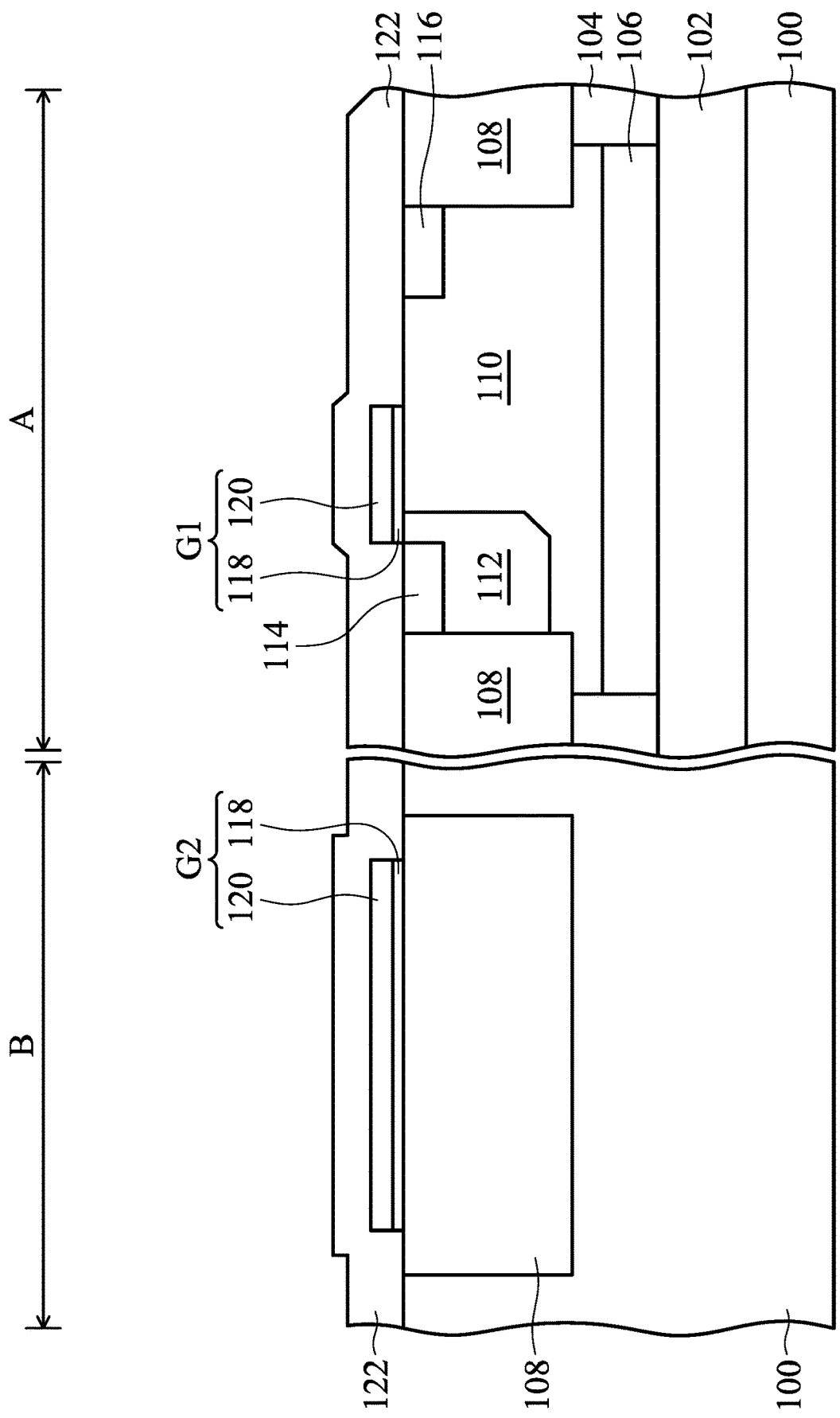
FIG. 2 is schematic cross section showing an intermediate stage of a method for forming a semiconductor device according to an embodiment of the invention.

In FIG. 2, a dielectric layer 122 is conformably formed over the semiconductor structure shown in both regions A and B shown in FIG. 1, covering the top surface of the semiconductor substrate 100 and exposed surfaces of the gate structures formed one the semiconductor substrate 100. In one embodiment, the dielectric layer 122 may comprise silicon oxide, silicon nitride or the like, and may have a thickness of about 200-1200 Å. The dielectric layer 122 may be thicker than the dielectric layer 118.

Figure 3:
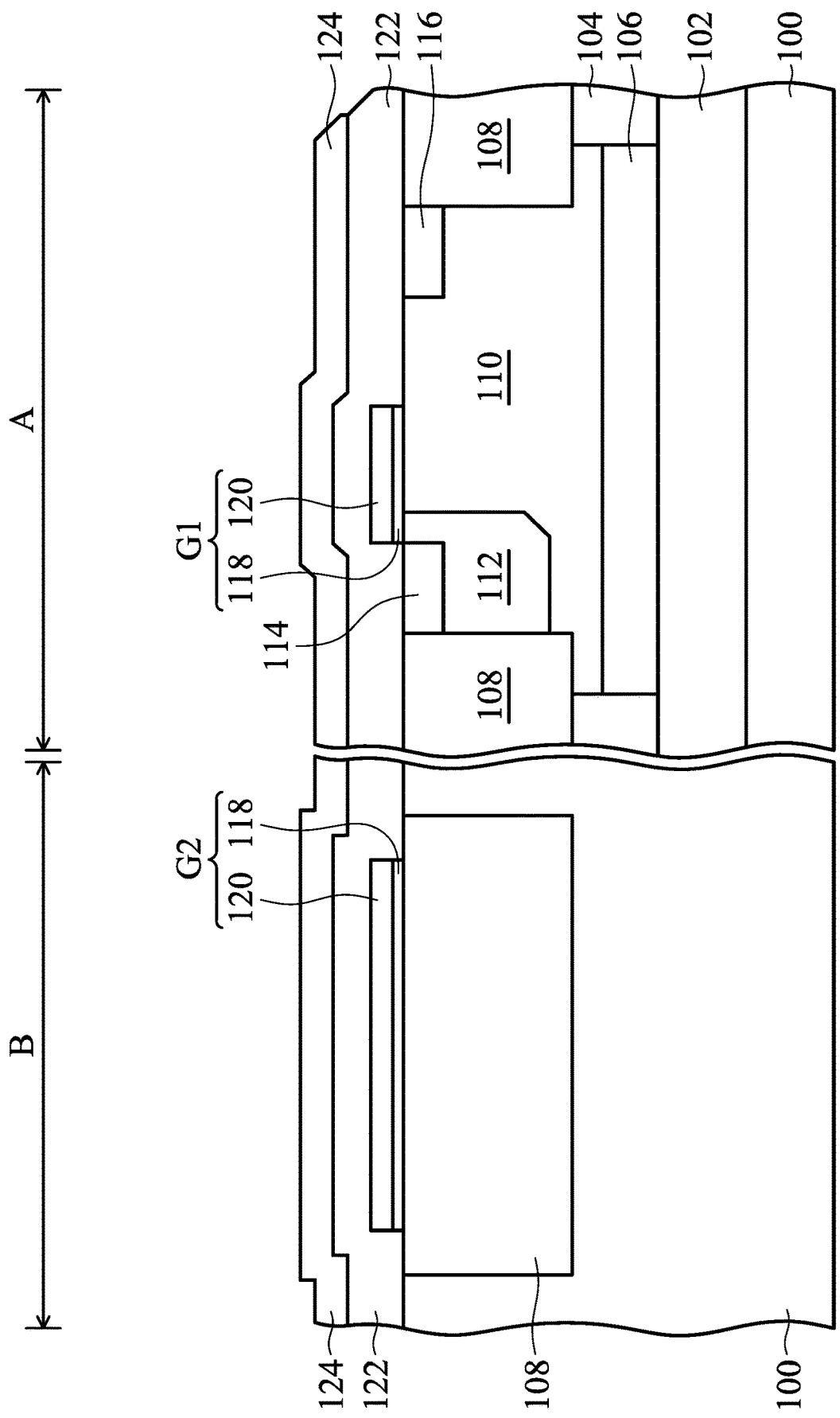
FIG. 3 is schematic cross section showing an intermediate stage of a method for forming a semiconductor device according to an embodiment of the invention.

In FIG. 3, a conductive layer 124 is conformably formed over the semiconductor structure in both regions A and B shown in FIG. 2, covering the top surface of the dielectric layer 122. In one embodiment, the conductive layer 124 may comprise conductive materials such as polysilicon, metal or the like, and may have a thickness of about 300-2000 Å. The conductive layer 124 may be thicker than the conductive layer 120.

Figure 4:
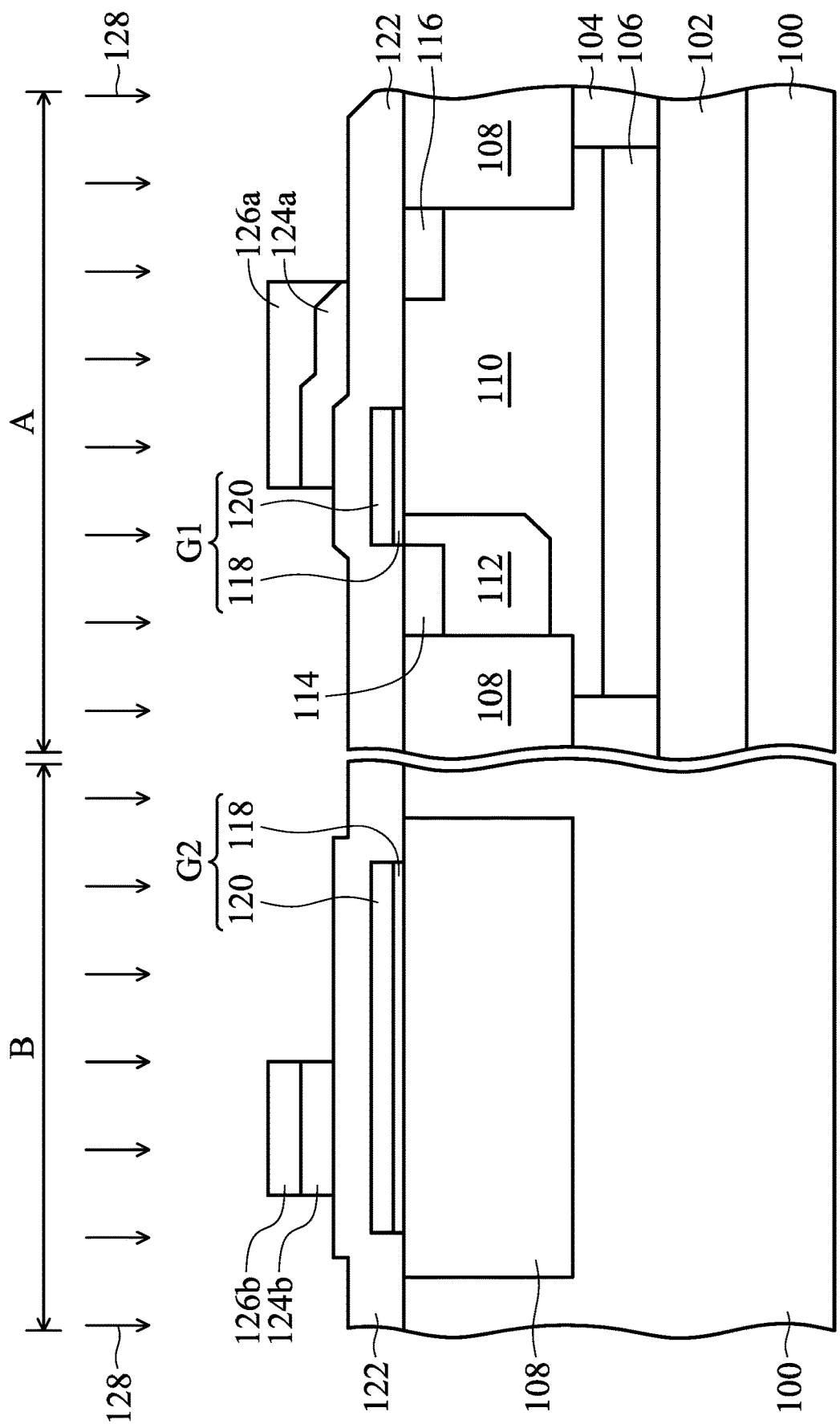
FIG. 4 is schematic cross section showing an intermediate stage of a method for forming a semiconductor device according to an embodiment of the invention.

In FIG. 4, patterned mask layers 126a and 126b are respectively formed over a portion of conductive layer 124 (see FIG. 3) in regions A and B, and an etching process 128 is performed to remove the portion of the conductive layer 124 not covered by the patterned mask layer 126a and 126b. As shown in FIG. 4, the patterned mask layer 126a and 126b may comprise material such as photoresists or the like, and the etching process 128 can be, for example, a dry etching process. The etching process 128 stops on the dielectric layer 122, thereby forming a patterned conductive layer 124a in region A and a patterned conductive layer 124b in region B. The patterned conductive layer 124a in region A is formed over a portion of the gate structure in region A and a portion of the semiconductor substrate 100 adjacent to the gate structure, and the patterned conductive layer 124b in region B is formed over a portion of the gate structure but is not over the semiconductor substrate 100.

Figure 5:
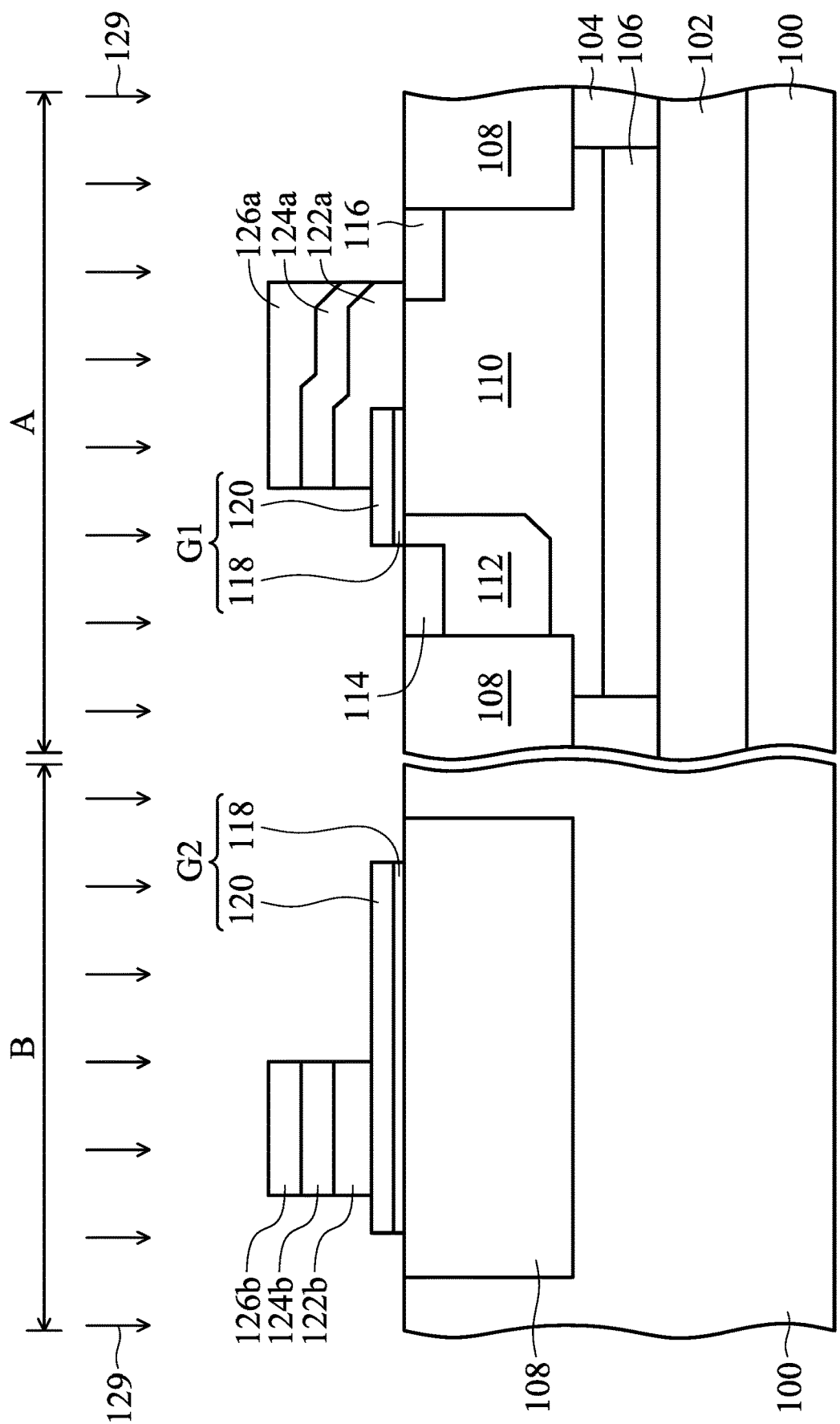
FIG. 5 is schematic cross section showing an intermediate stage of a method for forming a semiconductor device according to an embodiment of the invention.

In FIG. 5, another etching process 129 is performed next to remove the portion of the dielectric layer 122 (see FIG. 4) not covered by the patterned mask layer 126a and 126b, and the patterned conductive layer 124a and 124b. The etching process 129 can be, for example, a dry etching process. As shown in FIG. 5, the etching process 129 stops on the conductive layer 120 and the substrate 100, thereby respectively forming a patterned dielectric layer 122a in region A and a patterned dielectric layer 122b in region B. The patterned dielectric layer 122a in region A is formed under the patterned conductive layer 122a and over a portion of the gate structure in region A and a portion of the semiconductor substrate 100 adjacent to the gate structure, and the patterned dielectric layer 122b is formed under the patterned conductive layer 124b in region B and is formed over a portion of the gate structure but is not over the semiconductor substrate 100.

Figure 6:
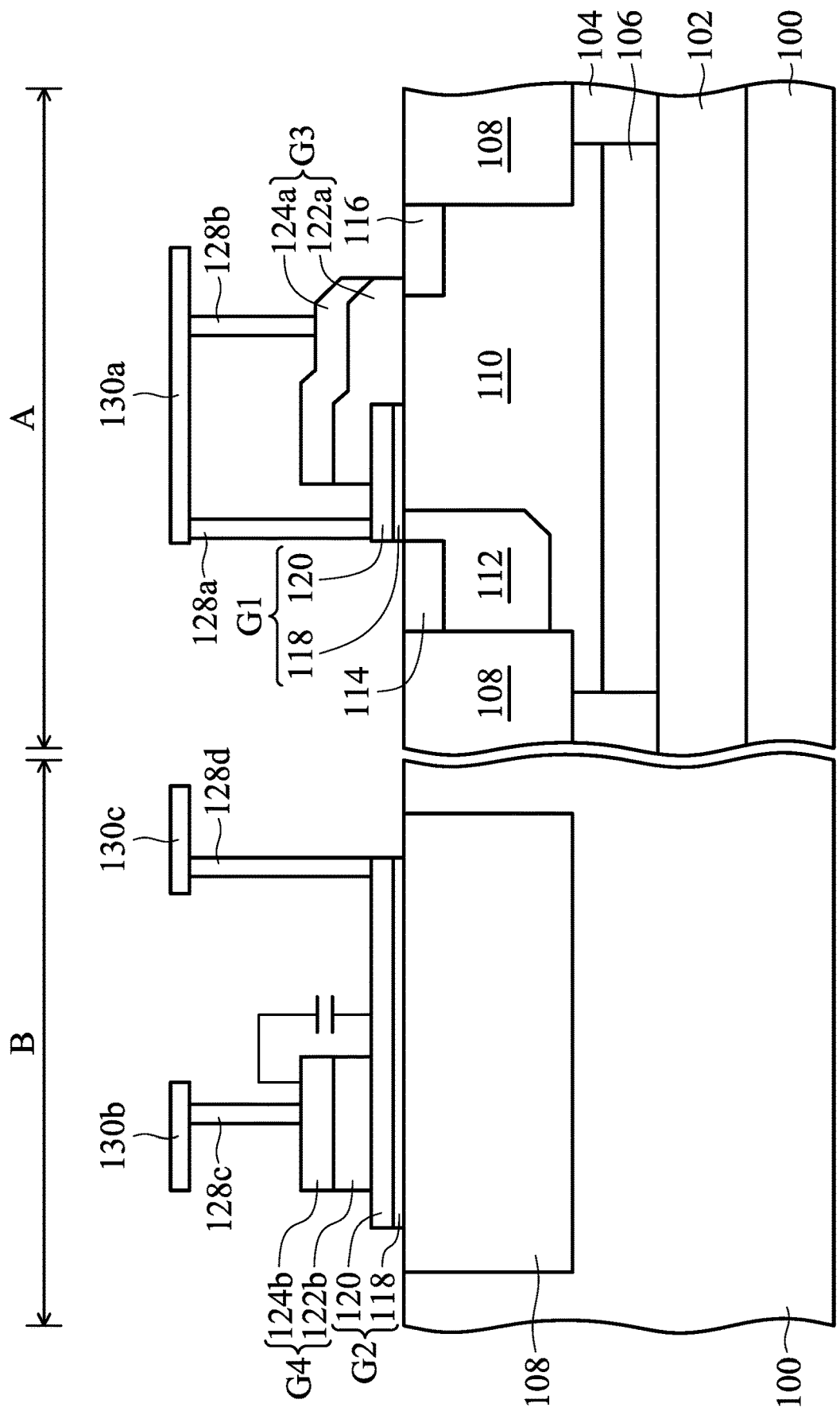
FIG. 6 is schematic cross section showing an intermediate stage of a method for forming a semiconductor device according to an embodiment of the invention.

In FIG. 6, after removal the patterned mask layers 126a and 126b shown in FIG. 5, another gate structure G3 comprising the patterned conductive layer 124a and the patterned dielectric layer 122a is formed in region A, covering a portion of about 20%-80% of a top surface of the underlying gate structure G1 comprising the conductive layer 120 and the dielectric layer 118. In addition, yet another gate structure G4 comprising the patterned conductive layer 124b and the patterned dielectric layer 122b is formed in region B, covering a portion of about 70%-90% of a top surface of the underlying gate structure G2 comprising the conductive layer 120 and the dielectric layer 118.

As shown in FIG. 6, in region A, the gate structure G3 comprising the patterned conductive layer 124a and the patterned dielectric layer 122a, and the gate structure G1 comprising the conductive layer 120 and the dielectric layer 118 may be combined to function as a combined gate of a semiconductor device capable of high-voltage operations, and the doped region 114 and the doped region 116 may function as source and drain regions, respectively. Through the use of the combined gate shown in FIG. 6, a more uniform electrical field contribution can be observed in the portion of the well region 110 underlying the combined gate during operations of the semiconductor device shown in FIG. 6 when compared with another semiconductor device that is similar to the one shown in FIG. 6, but which comprises only the gate structure G1 comprising a conductive layer 120 and a dielectric layer 118 and a dielectric layer 122. Accordingly, the semiconductor device capable of high-voltage operation shown in FIG. 6 can operate at a higher voltage of about 9-100 volts, which is about 100-1100% higher than a semiconductor device that is similar to the one shown in FIG. 6, but which comprises only the gate structure G1 comprising a conductive layer 120 and a dielectric layer 118 and a dielectric layer 122.

Moreover, in region B shown in FIG. 6, the conductive layer 124b, the dielectric layer 122b and the conductive layer 120 form an additional capacitor which can be simultaneously formed during formation of the semiconductor device capable of high-voltage operations shown in region A of FIG. 6.

As shown in FIG. 6, for the ease of illustrating the electrical potential provided to the combined gate in region A and the capacitor in region B, conductive contacts 128a, 128b, 128c and 128d, and conductive lines 130a, 130b, and 130c can be further provided to the semiconductor structure. In region A, the conductive contact 128a is connected to the conductive layer 120 and the conductive contact 128b is connected to the conductive layer 124a, and the conductive contacts 128a and 128b are both connected the conductive line 130a, so that the gate structure G3 comprising the patterned conductive layer 124a and the patterned dielectric layer 122a and the gate structure G1 comprising the conductive layer 120 and the dielectric layer 118 may be provided with the same electrical potential during operations. In addition, in region B, the conductive layer 124b is connected to the conductive contact 128c and the conductive line 130b, and the conductive layer 120 is connected to the conductive contact 128d and the conductive line 130c. The conductive lines 130b and 130c may be provided with different electrical potentials during operations, so that a capacitor can be formed by the conductive layers 124b and 120 and the dielectric layer 122. In one embodiment, the conductive contacts 128a, 128b, 128c and 128d may comprise conductive materials such as tungsten, copper or the like, and conductive lines 130a, 130b, and 130c may comprises materials such as tungsten, copper or the like.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a semiconductor substrate having a first conductivity type;
   a first well region formed in a portion of the semiconductor substrate, having a second conductivity type that is the opposite of the first conductivity type;
   a second well region formed in a portion of the first well region, having the first conductivity type;
   a first gate structure formed over a portion of the second well region and a portion of the first well region;
   a first doped region formed in a portion of the second well region, having the second conductivity type; and
   a second doped region formed in a portion of the first well region, having the second conductivity type;
   and
   a second dielectric layer formed over a portion of the first gate structure, a portion of the first well region, and a portion of the second doped region, wherein the second dielectric layer has a portion not vertically overlapped with a first dielectric layer of the first gate structure.

2. The semiconductor device as claimed in claim 1, wherein the first gate structure further comprises a first conductive layer formed over the first dielectric layer, and the second gate structure further comprises a second conductive layer formed over the second dielectric layer.

3. The semiconductor device as claimed in claim 2, further comprising:
   an isolation element disposed in a portion of the semiconductor substrate;
   a third conductive layer formed over the isolation element;
   a third dielectric layer formed over the third conductive layer; and
   a fourth conductive layer formed over the third dielectric layer.

4. The semiconductor device as claimed in claim 3, wherein the third conductive layer, the third dielectric layer, and the fourth conductive layer form a capacitor.

5. The semiconductor device as claimed in claim 3, wherein the third conductive layer and the second conductive layer are formed simultaneously.

6. The semiconductor device as claimed in claim 3, wherein the third dielectric layer and the second dielectric layer are formed simultaneously.

7. The semiconductor device as claimed in claim 3, wherein the fourth conductive layer and the second conductive layer are formed simultaneously.

8. The semiconductor device as claimed in claim 3, wherein the first conductivity type is P-type and the second conductivity type is N-type.

9. The semiconductor device as claimed in claim 3, wherein the first dielectric layer has a thickness of about 23-140 Å, and the second and third dielectric layers have a thickness of about 200-1200 Å.

10. The semiconductor device as claimed in claim 3, wherein the second dielectric layer covers about 20%-80% of a top surface of the first gate structure.

11. The semiconductor device as claimed in claim 3, wherein second conductive layer comprises polysilicon or metal.

12. A semiconductor device, comprising:
- a semiconductor substrate having a first conductivity type;
- a first well region formed in a portion of the semiconductor substrate, having a second conductivity type that is the opposite of the first conductivity type;
- a second well region formed in a portion of the first well region, having the first conductivity type;
- a first gate structure formed over a portion of the second well region and a portion of the first well region;
- a first doped region formed in a portion of the second well region, having the second conductivity type; and
- a second doped region formed in a portion of the first well region, having the second conductivity type;

and
- a second conductive layer formed over a portion of the first gate structure, a portion of the first well region, and a portion of the second well region, wherein the second conductive layer has a portion not vertically overlapped with a first dielectric layer of the first gate structure.

13. The semiconductor device as claimed in claim 12, wherein the first gate structure further comprises a first conductive layer formed over the first dielectric layer, and the second gate structure further comprises a second dielectric layer formed under the second conductive layer.

14. The semiconductor device as claimed in claim 13, further comprising:
- an isolation element disposed in a portion of the semiconductor substrate;
- a third conductive layer formed over the isolation element;
- a third dielectric layer formed over the third conductive layer; and
- a fourth conductive layer formed over the third dielectric layer.

15. The semiconductor device as claimed in claim 14, wherein the third conductive layer, the third dielectric layer, and the fourth conductive layer form a capacitor.

16. The semiconductor device as claimed in claim 14, wherein the third conductive layer and the second conductive layer are formed simultaneously.

17. The semiconductor device as claimed in claim 14, wherein the third dielectric layer and the second dielectric layer are formed simultaneously.

18. The semiconductor device as claimed in claim 14, wherein the fourth conductive layer and the second conductive layer are formed simultaneously.

19. The semiconductor device as claimed in claim 12, wherein the first conductivity type is P-type and the second conductivity type is N-type.

20. The semiconductor device as claimed in claim 12, wherein second conductive layer comprises polysilicon or metal.

21. A semiconductor device, comprising:
- a semiconductor substrate having a first conductivity type;
- a first well region formed in a portion of the semiconductor substrate, having a second conductivity type that is the opposite of the first conductivity type;
- a second well region formed in a portion of the first well region, having the first conductivity type;
- a first gate structure formed over a portion of the second well region and a portion of the first well region;
- a first doped region formed in a portion of the second well region, having the second conductivity type; and
- a second doped region formed in a portion of the first well region, having the second conductivity type;

and
- a second structure formed over a portion of the first gate structure, a portion of the first well region, and a portion of the second doped region, wherein the second structure has a portion not vertically overlapped with a first dielectric layer of the first gate structure.

* * * * *